(12) United States Patent
Lee (10) Patent No.: US 6,284,591 B1
(45) Date of Patent: *Sep. 4, 2001

(54) FORMATION METHOD OF INTERCONNECTION IN SEMICONDUCTOR DEVICE

(75) Inventor: Sang-in Lee, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 09/299,566

(22) Filed: Apr. 27, 1999

Related U.S. Application Data (63) Continuation-in-part of application No. 08/655,122, filed on May 28, 1996, now Pat. No. 6,001,683.

(30) Foreign Application Priority Data

Nov. 2, 1995 (KR) .................................................. 95-39443

(51) Int. Cl.[7] ................................................. H01L 21/8242
(52) U.S. Cl. ........................ 438/241; 438/253; 438/396; 438/598; 438/599; 438/618; 438/621
(58) Field of Search .................................... 438/241, 253, 438/396, 128, 129, 598, 599, 618, 621

(56) References Cited

U.S. PATENT DOCUMENTS 6,001,683 * 12/1999 Lee ........................................ 438/241

* cited by examiner

Primary Examiner—John F. Niebling
Assistant Examiner—Lynne A. Gurley
(74) Attorney, Agent, or Firm—Jones Volentine, PLLC

(57) ABSTRACT

A method of forming an interconnection by using a landing pad is disclosed. In a semiconductor device having a memory cell portion and a peripheral circuit portion, a refractory metal is used for the bitline instead of the usual polycide, to concurrently form a contact on an active region of an N-type and a P-type substrate. A landing pad is formed on the peripheral circuit portion at the same time as a bitline is formed on the memory cell portion. In such a process, a substantial contact hole for the interconnection is formed on the landing pad so that an aspect ratio of the contact can be lowered. Accordingly, when forming a metal interconnection, the contact hole for the interconnection is easily filled by Al-reflow so that the step coverage of the metal being deposited in the contact hole for the interconnection is enhanced, and the contact resistance is reduced. As a result, the reliability of the semiconductor device is improved.

32 Claims, 9 Drawing Sheets

FORMATION METHOD OF INTERCONNECTION IN SEMICONDUCTOR DEVICE

This application is a continuation-in-part of U.S. application Ser. No. 08/655,122, filed on May 28, 1996, now U.S. Pat. No. 6,001,683 which relies for priority upon Korean Patent Application No. 95-39433, filed on Nov. 2, 1995, the contents of both of which are herein incorporated by reference in their entirety.

BACKGROUND OF THE INVENTION

The present invention relates to a method of forming an interconnection in a semiconductor device, and relates more particularly, to a method of forming an interconnection in such a device by using a landing pad.

Interconnection technology in a semiconductor device can be divided into two steps, i.e., formation of a contact hole and formation of an interconnection. As a semiconductor device becomes high-integrated, a width of the interconnection line becomes more narrow. Furthermore, when the horizontal size of the contact is reduced, its vertical size is increased, which increases the aspect ratio of the contact. A metal interconnection must be multileveled to enable the enhancing of the operation speed of a device and to provide for a reliable interconnection. In addition, the filling of a contact hole is essential for the planarization of an interdielectric layer.

The filling techniques for filling contact holes in current multilevel interconnection formation processes consist mainly of either one of two methods. Such filling procedures usually involve either a physical vapor deposition (PVD) method or a chemical vapor deposition (CVD) method.

The PVD method involves depositing a metal such as aluminum in the contact hole by sputtering. However, when the aspect ratio increases because of the reduction of a contact hole size, e.g., to 1 $\mu$m or less, the step coverage of a metal deposited on the contact hole is degraded.

The CVD method of filling a contact hole is advantageous for obtaining excellent step-coverage characteristic. However, the CVD method still presents difficulties when the method involves depositing aluminum in the contact hole.

As the aspect ratio of the contact hole increases because of the high-integration of a semiconductor, e.g., as you move to a 256M DRAM and a 1G DRAM, it is difficult to fill the contact hole. This difficulty is present even when a new aluminum reflow method is used to fill the contact hole for the formation of the metal interconnection layer.

Accordingly, due to the difficulties in filling the contact holes, the step-coverage of the metal interconnection is degraded and the contact resistances are increased.

SUMMARY OF THE INVENTION

An object of the present invention to provide a method of forming an interconnection using a landing pad for lowering an aspect ratio of a contact to permit an aluminum (Al) reflow process to be effectively applied to a contact that is horizontally narrow and vertically deep.

To accomplish the above object of the present invention, there is provided a method of forming an interconnection in a semiconductor device having a memory cell portion and a peripheral circuit portion, the method comprising: forming an active region of the memory cell portion, forming an active region of the peripheral portion, forming a gate electrode over a silicon substrate, depositing a first insulating film over the gate electrode and the silicon substrate, forming a recess structure connected to the active region of the memory cell portion by etching the first insulating film, forming a contact hole for landing pad formation connected to the active region of the peripheral circuit portion by etching the first insulating film, depositing a metal layer over the first insulating film, the recess structure, and the contact hole, depositing a metal compound layer over the metal layer, the first insulating film, the recess structure, and the contact hole, depositing a metal material layer over the metal layer, the first insulating film, the recess structure, and the contact hole, to fill the recess structure and the contact hole, and removing portions of the metal compound layer and the metal material layer not in the recess structure and the contact hole to form a bitline and a landing pad.

The first insulating film may comprise a silicon oxide material. The first insulating film is preferably formed by chemical vapor deposition or high density plasma deposition.

In preferred method for forming an interconnection, after depositing the metal layer and before depositing the metal compound layer, the process may further comprise selectively forming an ohmic contact layer over the surface of the silicon substrate by reacting the metal layer with silicon and stripping away a non-reacted portion of the metal layer.

The recess structure may be formed by etching the first insulating film in multiple stages. The recess structure and the contact hole are preferably simultaneously formed on a P-type portion and an N-type portion of the active region.

The metal layer preferably comprises a material selected from the group consisting of Ti, W, Mo, Ta, Zr, Ni, and Co, and is preferably formed by sputtering or chemical vapor deposition. The metal compound layer preferably comprises a material selected from the group consisting of TiN, WN, TaN, ZrN, TiC, WC, TaC, and ZrC. The metal material film preferably comprises a material selected from the group consisting of Cu, Al, W, Mo, Ta, Ti, Zr, a nitride of a refractory metal and carbide, and a refractory metal, and is preferably formed by chemical vapor deposition.

The elimination of the metal compound film and the metal material film is preferably performed by chemical mechanical polishing or an etchback process.

In a preferred method for forming an interconnection, after depositing the metal compound layer, the process may further comprise annealing the metal layer to form an ohmic contact.

According to the method of forming an interconnection of the above-mentioned present invention, the landing pad on the peripheral circuit portion is concurrently formed with the bitline in the memory cell portion during manufacturing a memory device, e.g., a DRAM device. Such concurrent formation has the effect of reducing the thickness of an insulating film that can be obtained during a successive step of forming a contact hole for interconnection. As a result, it is easy to etch the insulating film when forming the contact hole and so a contact hole having a small aspect ratio can be formed on the landing pad.

The above mentioned process makes it easier to fill the contact hole for interconnection by an Al reflow method when forming a metal interconnection layer. In addition, the step-coverage of a metal deposited on the contact hole for interconnection is enhanced and contact resistance is reduced. As a result, the reliability of a semiconductor device is increased by producing by such a process.

BRIEF DESCRIPTION OF THE DRAWINGS

The above object and advantages of the present invention will become more apparent by describing in detail preferred embodiment thereof with reference to the attached drawings in which.

DETAILED DESCRIPTION OF THE INVENTION

The above object and advantages of the present invention will become more apparent by describing in detail preferred embodiments of the present invention, with reference to the attached drawings.

A first embodiment of the present invention is illustrated by FIGS. 1 through 11, which are cross-sectional views of a memory cell portion in respective steps of a process for forming an interconnection in a semiconductor device according to a preferred embodiment of the present invention. A second embodiment of the present invention is illustrated by FIGS. 12 through 20, which are cross-sectional views of a peripheral circuit portion in respective steps of a process for forming an interconnection in a semiconductor device.

Figure 1:
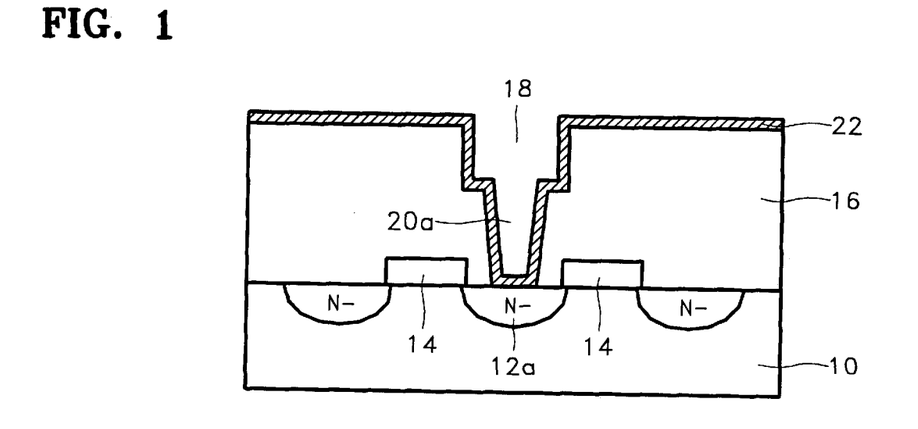
FIG. 1 is a cross-sectional view of a memory cell portion of a semiconductor device process substrate resulting from an interconnection process step, wherein a first insulating film has been etched to form a groove and a direct contact hole, according to a first preferred embodiment of the present invention.
Figure 12:
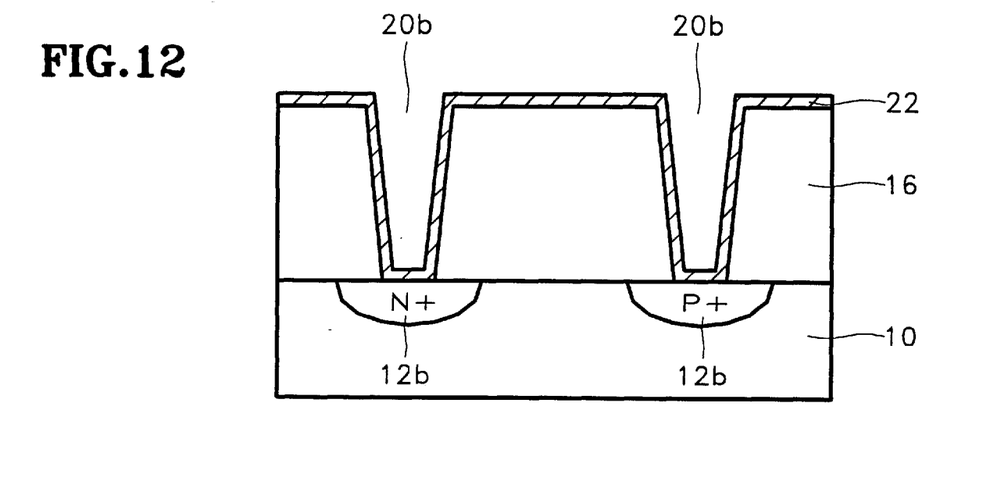
FIG. 12 is a cross-sectional view of a peripheral circuit portion of an active region of a memory cell portion of a semiconductor device process substrate resulting from an interconnection process step, wherein a first insulating film has been etched to form a contact hole for landing pad formation, according to a second preferred embodiment of the present invention.

Referring to FIGS. 1 and 12, a cross section is shown of a semiconductor device having a gate electrode 14, an active region 12a of a memory cell portion, and an active region 12b of a peripheral circuit portion, i.e., source and drain regions are formed on a silicon substrate 10 in a usual manner. Also, the substrate shown in FIGS. 1 and 10 has a first insulating film layer 16 formed over it. This first insulating film preferably comprises borophospho-silicate glass (BPSG) or undoped $SiO_2$ glass (USG), which are deposited by chemical vapor deposition (CVD), or a high-density plasma (HDP) oxide, which is deposited by HDP deposition. The first insulating film can be planarized by a chemical mechanical polishing (CMP) or an etch back process.

A bitline of the memory cell portion is formed over the substrate by dual-damascene. In this process, the whole surface of the resultant structure is patterned reversely form the bitline pattern. The first insulating film 16 is etched to approximately 0.4 $\mu$m depth in a usual manner to form a groove 18.

The first insulating film 16 is then re-etched by photolithography and etching so that a direct contact hole 20a is formed under groove 18 in order to be connected to an N-type active region 12a of the memory cell portion. At the same time, a contact hole 20b, to be used for landing pad formation, is formed in the peripheral region to be connected to an N-type or P-type active region 12b of the peripheral circuit portion. Accordingly, a recess structure for the bitline of the memory cell potion is formed, including a direct contact hole 20a and a groove 18.

The particular methods of forming a barrier metal layer before an interconnection layer can be varied according to contact resistance, contact size, and contact aspect ratio. One method involves depositing a metal layer, heating it for silicidation by rapid thermal annealing (RTA), stripping out the unreacted metal layer, and then depositing a barrier metal layer. This method is described as follows.

A metal film 22 to be used for an ohmic contact is deposited with Ti over the whole surface of the resultant structure, preferably using sputtering. In this case, the metal film 22 for ohmic contact can be formed of one or more of Ti, W, Mo, Ta, Zr, Ni, and Co.

Subsequently, the resultant structure is thermally treated by rapid thermal annealing (RTA), preferably in an $N_2$ or Ar atmosphere, for about 10–30 seconds at a temperature of about 500° C.–700° C. A nonreacted portion of the Ti film 22 is then stripped away, preferably by sulfuric acid or another chemical solution.

Figure 2:
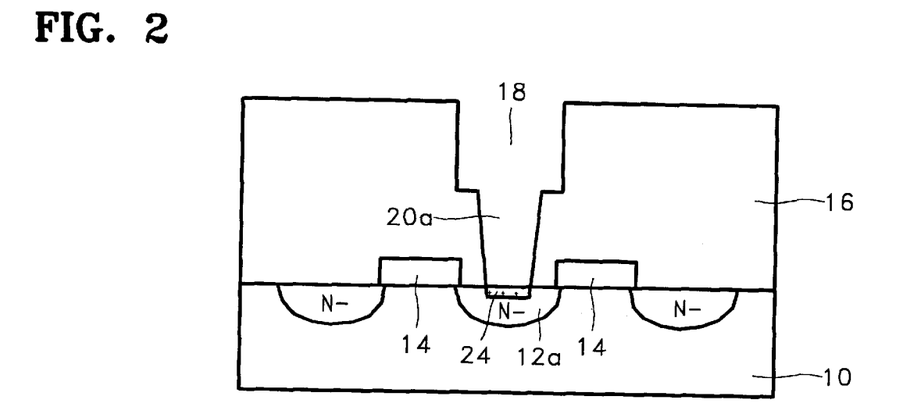
FIG. 2 is a cross-sectional view of a memory cell portion of a semiconductor device process substrate resulting form an interconnection process step, wherein a ohmic contact layer has been deposited in the contact hole, according to a first preferred embodiment of the present invention.
Figure 13:
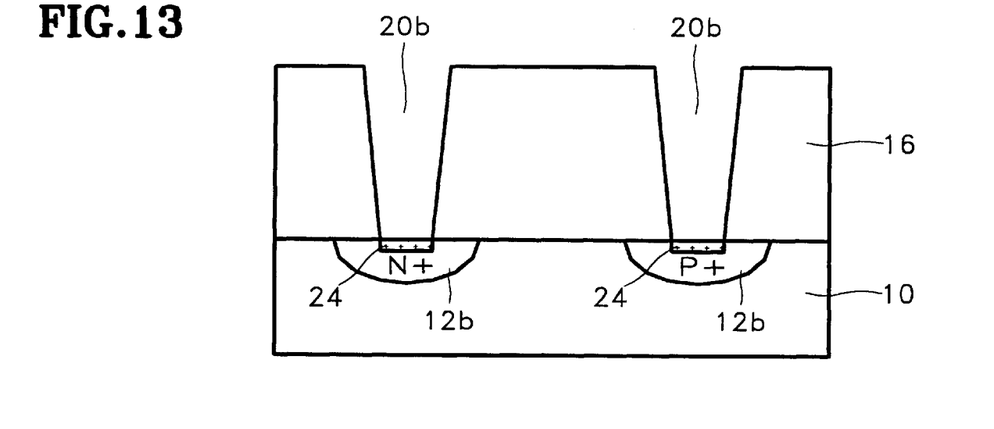
FIG. 13 is a cross-sectional view of a peripheral circuit portion of a semiconductor device process substrate resulting from an interconnection process step, wherein an ohmic contact layer has been deposited in the contact hole, according to a second preferred embodiment of the present invention.

Referring to FIGS. 2 and 13, a metal film 22 to be used for an ohmic contact, i.e., a Ti film, is reacted with silicon on the surface of semiconductor substrate 10 under the direct contact hole 20a and the contact hole 20b for landing pad formation, to thereby selectively form a TiSi ohmic contact layer 24.

The TiSi ohmic contact layer 24 is then thermally treated, preferably by RTA in an $N_2$ or Ar atmosphere, for about 10–30 seconds at a temperature of about 700° C.–950° C. to be changed into C54-$TiSi_2$, which is stable and has a high electrical conductivity.

A second method of forming a barrier metal layer involved sequentially depositing a metal layer for adhesion or wetting and a barrier metal layer for a diffusion barrier. This method is described as follows.

After forming a recess structure for the bitline and a contact hole for the landing pad, a metal layer for adhesion or wetting is deposited with Ti over the whole surface of the resultant structure. In this case, the metal film used as a metal layer for adhesion or wetting is preferably the same as the metal film used as an ohmic contact metal above. However, this layer is not removed until the barrier metal is formed. Conformality and adhesion of the diffusion barrier metal can be increased by depositing the metal layer for adhesion or wetting.

Figure 3:
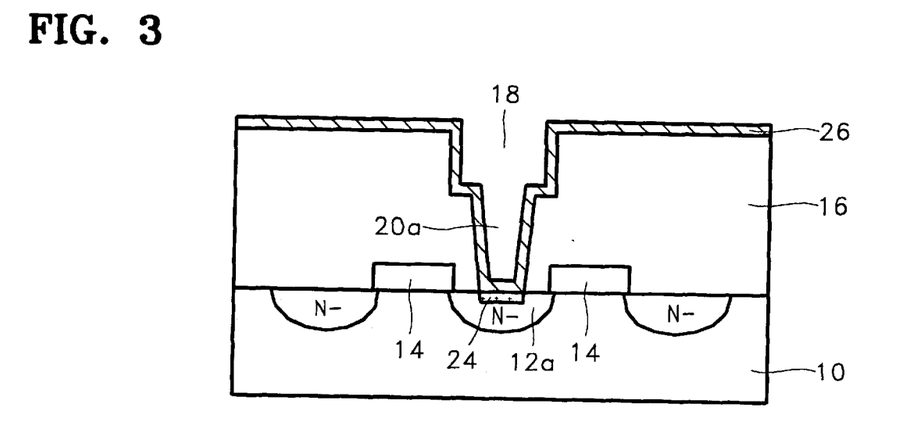
FIG. 3 is a cross-sectional view of a memory cell portion of a semiconductor device process substrate resulting from an interconnection process step, wherein a diffusion barrier film is deposited over the surface of the substrate including the surfaces of the contact hole and the ohmic layer, according to a first preferred embodiment of the present invention.
Figure 14:
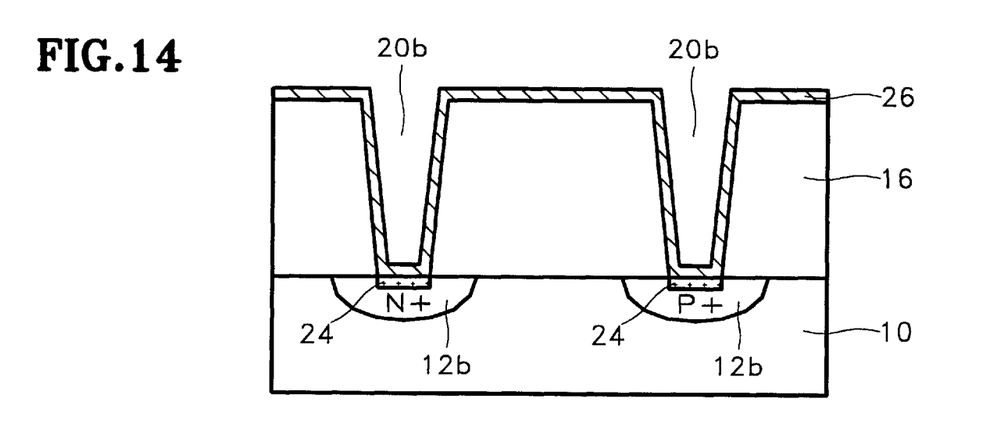
FIG. 14 is a cross-sectional view of a peripheral circuit portion of a semiconductor device process substrate resulting from an interconnection process step, wherein a diffusion barrier film is deposited over the surface of the substrate including the surfaces of the contact hole and the ohmic layer, according to a second preferred embodiment of the present invention.

Referring to FIGS. 3 and 14, TiN is deposited over the whole surface of the resultant structure by reactive sputtering to a thickness of about 100 Å–1,200 Å, to thereby form a diffusion barrier film 26. This diffusion barrier film 26 is preferably formed out of either a refractory metal nitride such as WN, TaN, and ZrN, or a refractory metal carbide such as TiC, WC, TaC and ZrC. In the case where a metal layer for adhesion or wetting and a diffusion barrier layer have been deposited after forming a barrier metal, an annealing process such as a rapid thermal nitridation (RTN) process is performed, preferably in an $NH_3$ atmosphere at a temperature of about 700° to 950° C. This annealing process is needed to form a stable ohmic contact, and enhance the barrier characteristics of the barrier metal layer.

Figure 4:
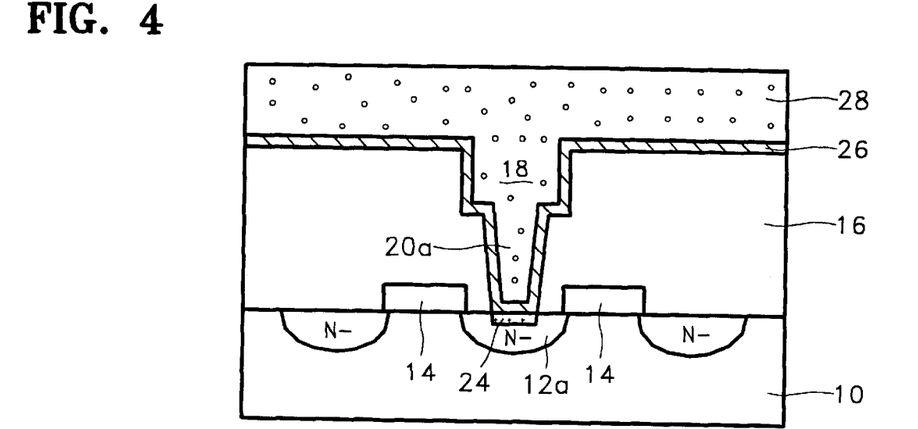
FIG. 4 is a cross-sectional view of a memory cell portion of a semiconductor device process substrate resulting from an interconnection process step, wherein a metal material film is deposited over the whole surface of the structure and also filling the contact hole, according to a first preferred embodiment of the present invention.
Figure 15:
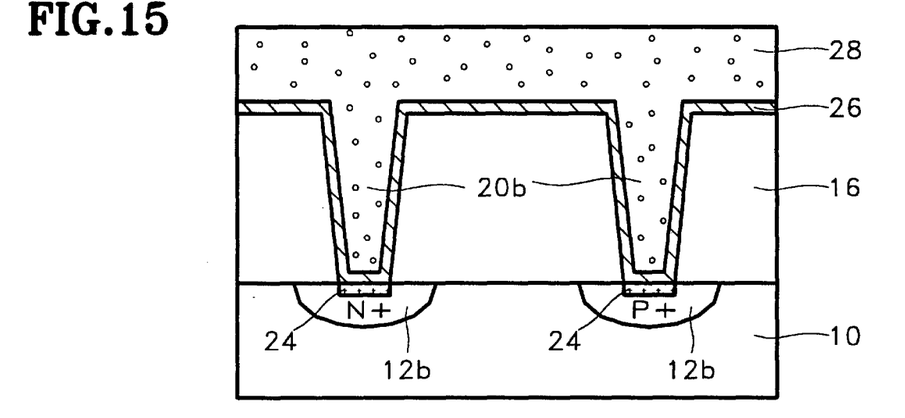
FIG. 15 is a cross-sectional view of a peripheral circuit portion of a semiconductor device process substrate resulting from an interconnection process step, wherein a metal material film is deposited over the whole surface of the structure and also filling the contact hole, according to a second preferred embodiment of the present invention.

Referring to FIGS. 4 and 15, a metal material film 28 is formed by depositing a refractory metal such as W, Mo, Cu, Ta, Ti, or Zr, which is not easily oxidized at a high temperature, over the whole surface of the resultant structure, preferably by a CVD process to a thickness of about 1,000 Å–6,000 Å.

The recess structure, including the groove 18 and the direct contact hole 20a, is filled, as is the contact hole 20b that will be used for the formation of the landing pad. In such a step, the refractory metal can be replaced with the refractory metal compound.

The refractory metal or the refractory metal compound, such as the refractory metal nitride or the refractory metal carbide, is used for forming the bitline. This material is used instead of polycide, so that a contact can be concurrently formed on active regions of both an N-type and a P-type.

Figure 5:
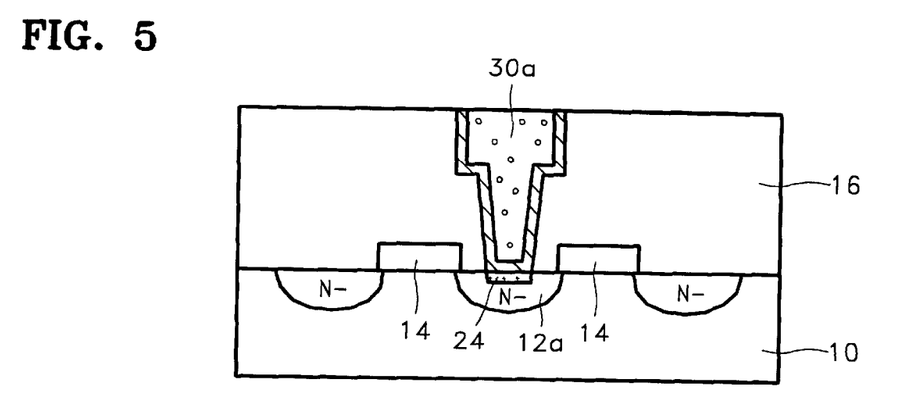
FIG. 5 is a cross-sectional view of a memory cell portion of a semiconductor device process substrate resulting from an interconnection process step, wherein a bitline has been formed in the substrate, according to a first preferred embodiment of the present invention.
Figure 6:
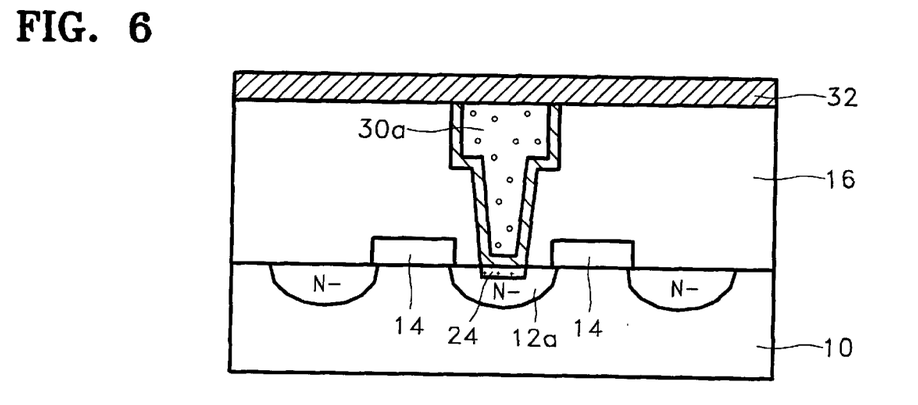
FIG. 6 is a cross-sectional view of a memory cell portion of a semiconductor device process substrate resulting from an interconnection process step, wherein a film layer has been on the surface of the substrate such that the bitline is also covered with the film layer, according to a first preferred embodiment of the present invention.
Figure 16:
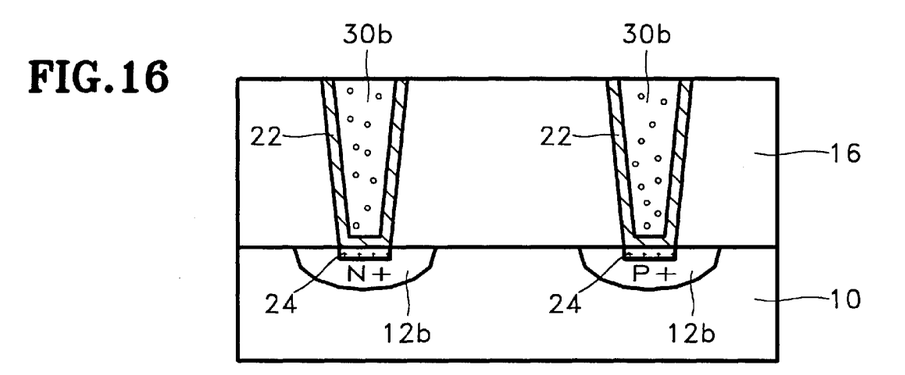
FIG. 16 is a cross-sectional view of a peripheral circuit portion of a semiconductor device process substrate resulting from an interconnection process step, wherein a landing pad has been formed in the substrate, according to a second preferred embodiment of the present invention.
Figure 17:
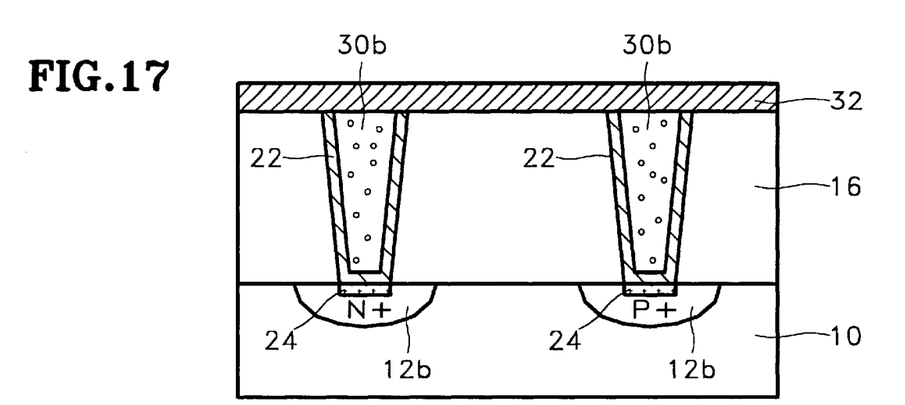
FIG. 17 is a cross-sectional view of a peripheral circuit portion of a semiconductor device process substrate resulting from an interconnection process step, wherein a SiN film layer has been formed on the surface of the substrate such that the landing pad is also covered with the film layer, according to a second preferred embodiment of the present invention.

Referring to FIGS. 5 and 16, portions of the diffusion barrier film 26 and the metal material film 28 that do not fill the recess structure and contact hole 20b are eliminated, preferably by a chemical mechanical polishing (CMP) or etchback process. This causes a bitline 30a and a landing pad 30b to be formed concurrently.

Figure 7:
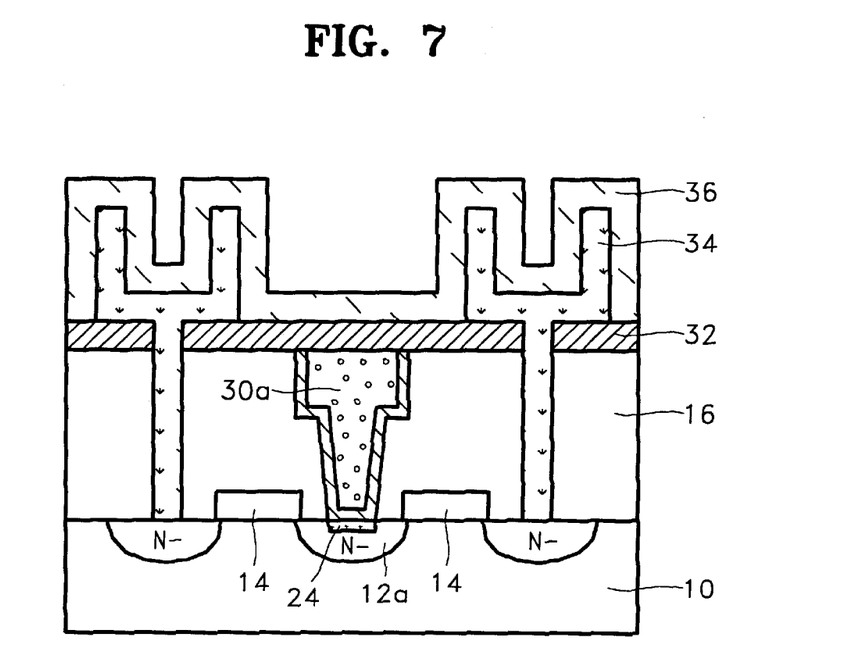
FIG. 7 is a cross-sectional view of a memory cell portion of a semiconductor device process substrate resulting from an interconnection process step, wherein a upper and lower electrode have been formed upon the film layer such that the lower electrode extends down through the film layer and the first the first insulating film layer, extending all the way down the silicon substrate layer.

Referring to FIGS. 6, 7, 17 and 18, an insulating film 32 such as an oxide layer, nitride layer, or oxynitride layer, is formed over the whole surface of the resultant structure. Such a layer is preferably formed by deposition or plasma treatment. As shown in FIG. 7, a lower electrode 34 of a capacitor, a dielectric film (not shown) and an upper electrode 36 are formed over the memory cell portion in a usual capacitor formation method.

Figure 8:
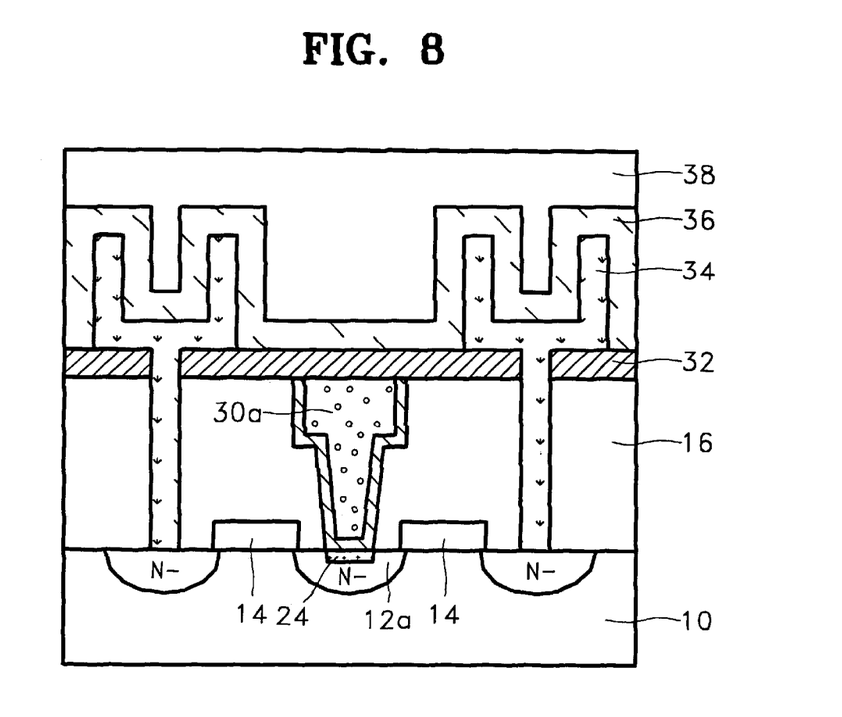
FIG. 8 is a cross-sectional view of a memory cell portion of a semiconductor device process substrate resulting from an interconnection process step, wherein a second insulating layer has been deposited upon the substrate which layer covers the upper electrode surface.
Figure 19:
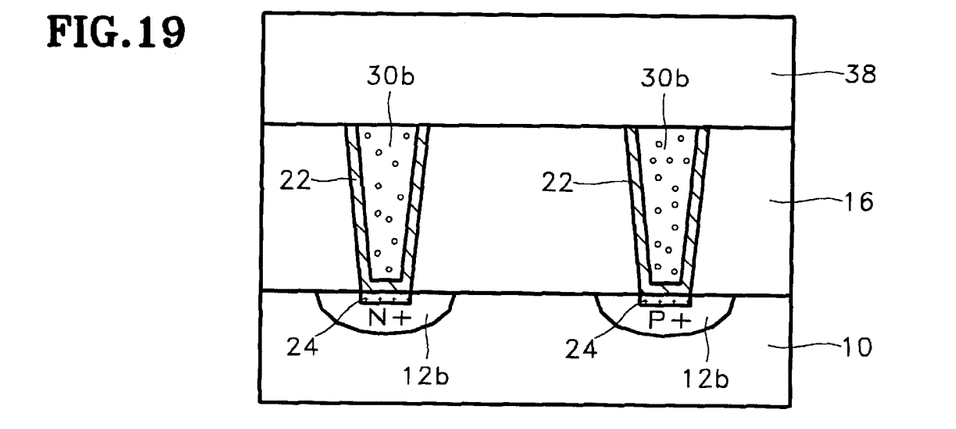
FIG. 19 is a cross-sectional view of a peripheral circuit portion of a semiconductor device process substrate resulting from an interconnection process step, wherein a second insulating layer has been deposited upon the substrate and the layer covers the top of the landing pad area, according to a second preferred embodiment of the present invention.
Figure 20:
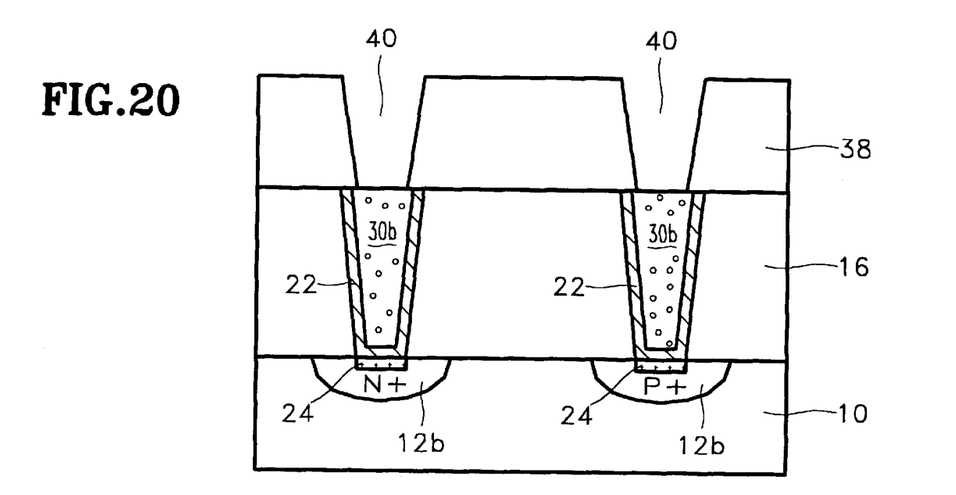
FIG. 20 is a cross-sectional view of a peripheral circuit portion of a semiconductor device process substrate resulting from an interconnection process step, wherein the second insulating film layer on the landing pad has been etched to produce a contact hole for an interconnection, according to a second preferred embodiment of the present invention.

Referring to FIGS. 8 and 19, second insulating film 38 is deposited over the whole surface of the resultant structure.

Figure 9:
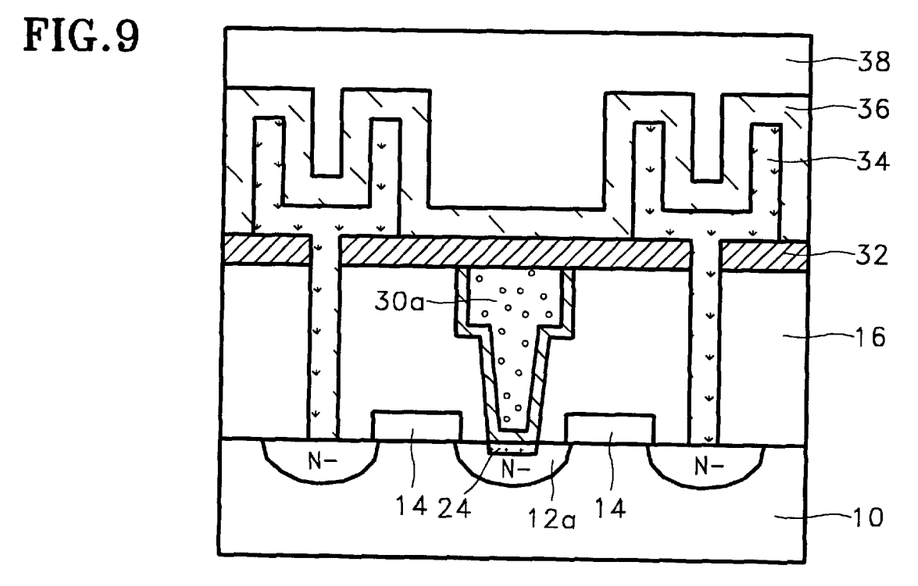
FIG. 9 is a cross-sectional view of a memory cell portion a semiconductor device process substrate resulting from an interconnection process step, corresponding to the step of FIG. 18.
Figure 18:
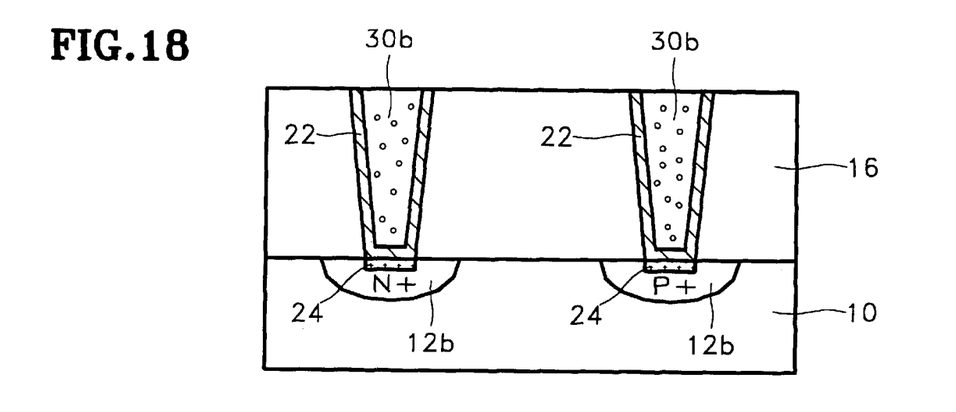
FIG. 18 is a cross-sectional view of a peripheral circuit portion of a semiconductor device process substrate resulting from an interconnection process step, wherein the SiN film of the peripheral portion of the substrate has been eliminated, according to a second preferred embodiment of the present invention.

Referring to FIGS. 9 and 18, a contact hole 40 for interconnection is formed by etching second insulating film 38 on landing pad 30b formed on the peripheral portion. The structure in the memory cell portion remains the same.

Figure 10:
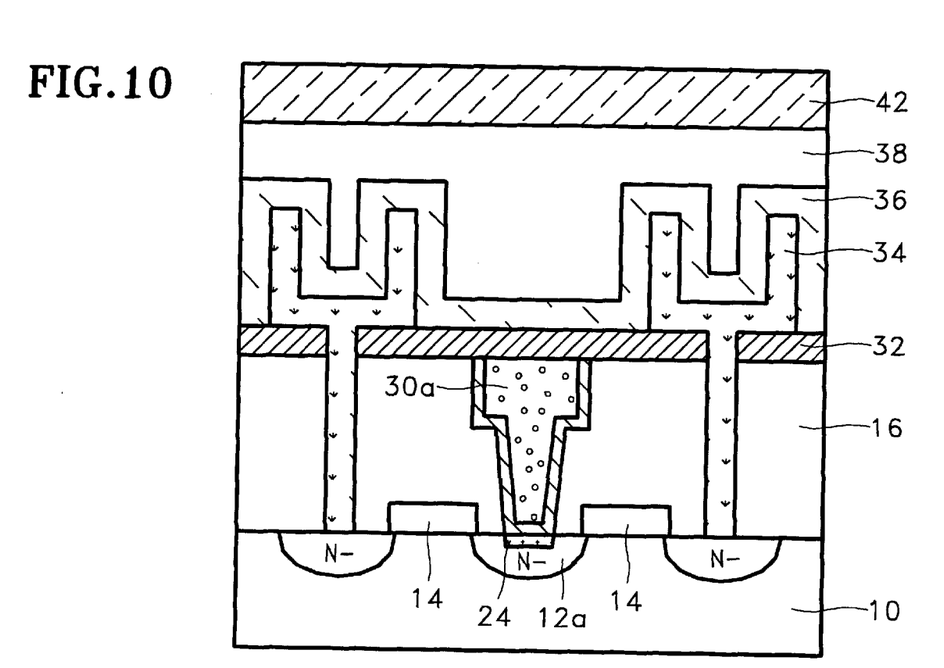
FIG. 10 is a cross-sectional view of a memory cell portion of a semiconductor device process substrate resulting from an interconnection process, wherein a conductive metal layer is deposited on the surface of the substrate by a sputtering step.
Figure 21:
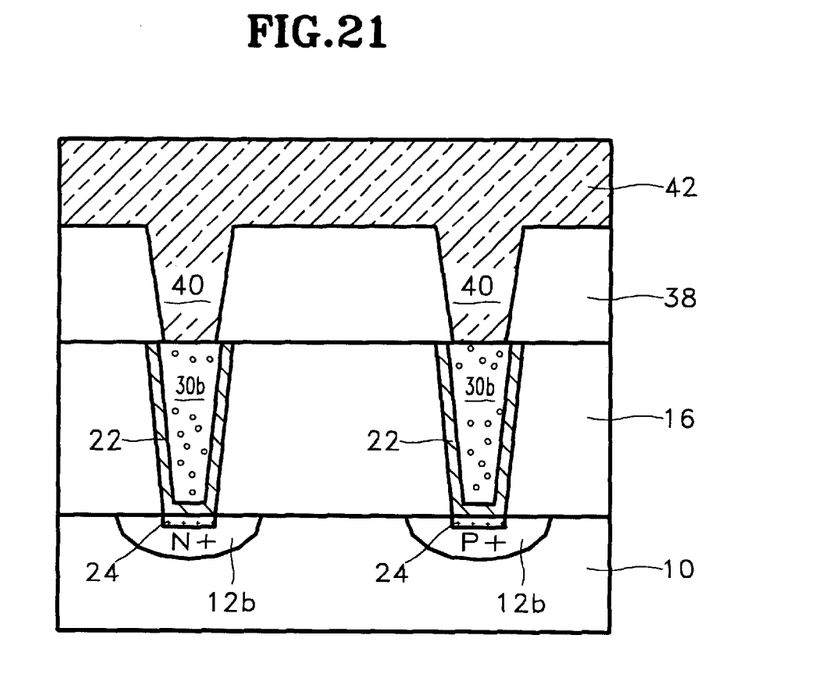
FIG. 21 is a cross-sectional view of a peripheral circuit portion of a semiconductor device process substrate resulting from an interconnection process, wherein a conductive metal layer is deposited by a sputtering step onto the surface of the substrate and into the contact hole of the landing pad.

Referring to FIGS. 10 and 21, a metal layer 42 for interconnection is formed by depositing and patterning a metal such as Al or W, having high conductivity, over the whole surface of the resultant structure, to thereby fill contact hole 40 for interconnection, and by depositing a metal layer, such as W, to form a plug in contact hole 40, preferably using a CMP or etchback process, and then forming an Al interconnection. In this process step, the metal layer for interconnection can be formed of a metal such as Cu, Ag, or Au, or a metal compound such as Al—Cu, Al—Si—Cu, or Ag—Cu.

Figure 11:
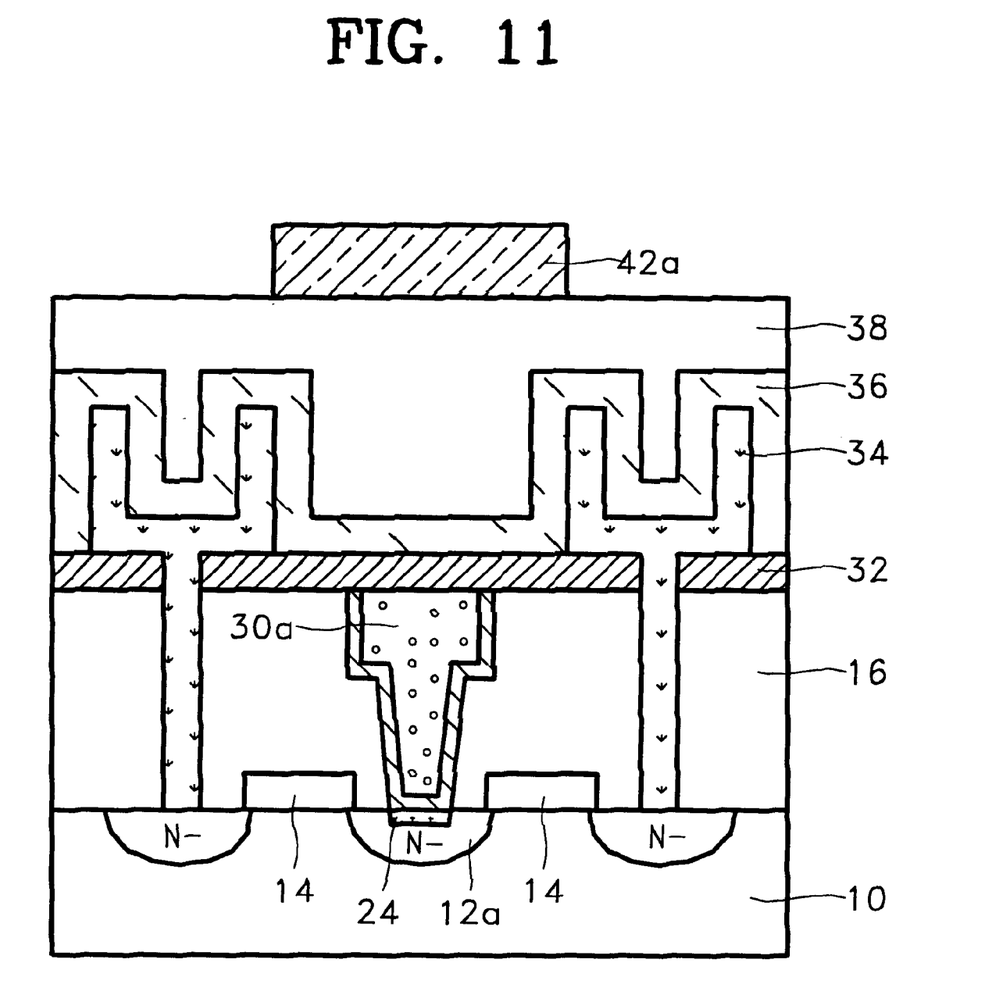
FIG. 11 is a cross-sectional view of a memory cell portion of a semiconductor device process substrate resulting from an interconnection process, wherein the top surface of the substrate has been etched to remove part of the top metal layer for patterned interconnectivity.
Figure 22:
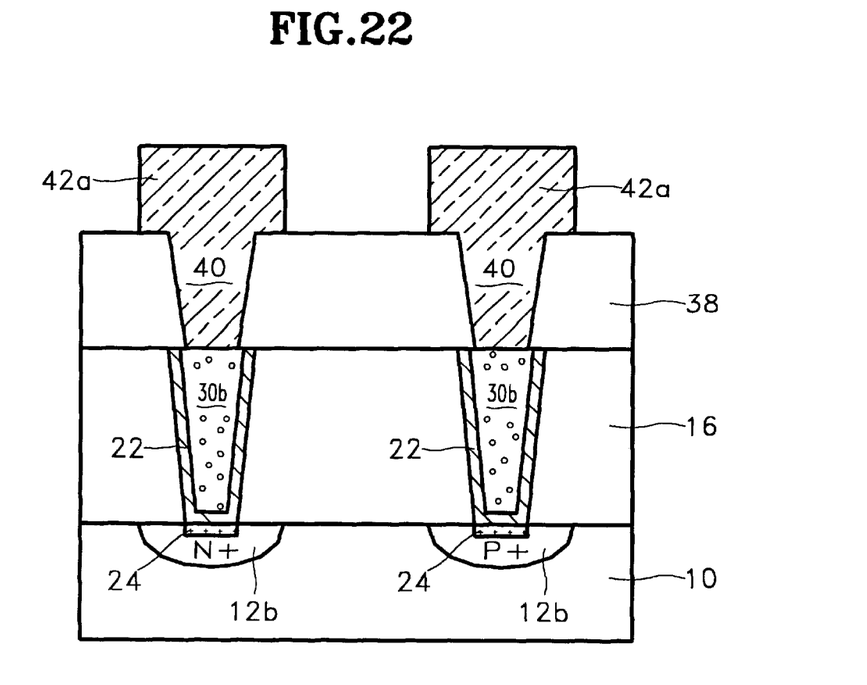
FIG. 22. is a cross-sectional view of a peripheral circuit portion of a semiconductor device process substrate resulting from an interconnection process, wherein the top surface of the substrate has been etched to remove part of the top metal layer and form an interconnection line for patterned interconnectivity.

According to the method of forming an interconnection of the present invention, when the bitline of the memory cell portion, for example, a bitline 42a, as shown in FIGS. 11 and 22, is formed during manufacturing of the memory device, in particular when a DRAM is formed, the landing pad, which is filled with the refractory metal, is concurrently formed on the peripheral circuit portion. Such a concurrent formation step has the effect of reducing the thickness of an insulating film that can be obtained during a successive step of forming a contact hole for interconnection. As a result, it is easier to etch the contact hole for interconnection and a contact hole having a small aspect ratio is also formed on the landing pad.

Accordingly, the contact hole for interconnection is easily filled by an Al reflow method when forming a metal interconnection layer. Furthermore, the step-coverage of depositing a metal on the contact hole for interconnection is enhanced, and its contact resistance is reduced. As a result, the reliability of the semiconductor device is increased.

It should be understood that the invention is not limited to the illustrated embodiment and that many changes and modifications can be made within the scope of the present invention by a skilled person in the art.

What is claimed is:

1. A method of forming an interconnection in a semiconductor device having a memory cell portion and a peripheral circuit portion, the method comprising:

forming an active region of the memory cell portion and the peripheral portion;

forming a gate electrode over a silicon substrate;

forming a first insulating film over the gate electrode and the silicon substrate;

forming a recess structure connected to the active region of the memory cell portion and a first contact hole for landing pad formation connected to the active region of the peripheral circuit portion by etching the first insulating film;

forming a first metal material layer filling the recess structure and the first contact hole to form a conductive line and a landing pad.

2. A method of forming an interconnection in a semiconductor device according to claim 1, wherein after forming the recess structure and the first contact hole, the process further comprises:

forming a metal layer over the first insulating film, the recess structure, and the first contact hole; and forming a metal compound layer over the metal layer, the first insulating film, the recess structure, and the first contact hole.

3. A method of forming an interconnection in a semiconductor device according to claim 1, wherein the first insulating film comprises a silicon oxide material.

4. A method of forming an interconnection in a semiconductor device according to claim 1, wherein the first insulating film is formed by chemical vapor deposition or high density plasma deposition.

5. A method of forming an interconnection in a semiconductor device according to claim 2, wherein after forming the metal layer and before forming the metal compound layer, the process further comprises selectively forming an ohmic contact layer over the surface of the silicon substrate by reacting the metal layer with silicon and stripping away a non-reacted portion of the metal layer.

6. A method of forming an interconnection in a semiconductor device according to claim 1, wherein the recess structure is formed by etching the first insulating film in multiple stages.

7. A method of forming an interconnection in a semiconductor device according to claim 1, wherein the recess structure and the first contact hole are simultaneously formed on a P-type portion and an N-type portion of the active region.

8. A method of forming an interconnection in a semiconductor device according to claim 2, wherein the metal layer comprises a material selected from the group consisting of Ti, W, Mo, Ta, Zr, Ni, and Co.

9. A method of forming an interconnection in a semiconductor device according to claim 2, wherein the metal layer is formed by sputtering or chemical vapor deposition.

10. A method of forming an interconnection in a semiconductor device according to claim 2, wherein the metal compound layer comprises a material selected from the group consisting of TiN, WN, TaN, ZrN, TiC, WC, TaC, and ZrC.

11. A method of forming an interconnection in a semiconductor device according to claim 1, wherein the first metal material layer comprises a material selected from the group consisting of Cu, Al, W, Mo, Ta, Ti, Zr, a nitride of a refractory metal and carbide, and a refractory metal.

12. A method of forming an interconnection in a semiconductor device according to claim 1, wherein the first metal material layer is formed by sputtering or chemical vapor deposition.

13. A method of forming an interconnection in a semiconductor device according to claim 2, wherein after forming the metal compound layer, the process further comprises annealing the metal layer to form an ohmic contact for enhancing the barrier characteristics.

14. A method of forming an interconnection in a semiconductor device according to claim 1, wherein after forming the recess structure and the first contact hole, the process further comprises forming a metal layer over the first insulating film, the recess structure, and the first contact hole.

15. A method of forming an interconnection in a semiconductor device according to claim 1, wherein after forming the recess structure and the first contact hole, the process further comprises forming a metal compound layer over the first insulating film, the recess structure, and the first contact hole.

16. A method of forming an interconnection in a semiconductor device according to claim 12, wherein the chemical vapor deposition is performed by a blanket deposition method or a selective deposition method.

17. A method of forming an interconnection in a semiconductor device according to claim 1, the method further comprising:

forming a second insulating film over the conductive line and the landing pad;

forming a second contact hole for interconnection by etching the second insulating film over the landing pad;

forming a second metal material layer filling the second contact hole for interconnection; and forming an interconnection by patterning the second metal material layer.

18. A method of forming an interconnection in a semiconductor device according to claim 17, wherein the second metal material layer comprises a material selected from the group consisting of Al, Au, Cu, Ag, an Al—Cu compound, and Al—Si—Cu compound and an Ag—Cu compound.

19. A method of forming an interconnection in a semiconductor device according to claim 17, wherein the step of forming the second metal material layer filling the second contact hole for interconnection is performed by a member selected from the group consisting of an aluminum reflow method, a high temperature sputtering method, and a chemical vapor deposition method.

20. A method of forming an interconnection in a semiconductor device according to claim 1, wherein after forming the first insulating film, the process further comprises a step of forming spin on glass (SOG) on the whole surface of the first insulating film and then eliminating the SOG and a part of the first insulating film by a full etchback method.

21. A method of forming an interconnection in a semiconductor device having a memory cell portion and a peripheral circuit portion, the method comprising:

forming an active region of the memory cell portion and the peripheral portion;

forming a gate electrode over a silicon substrate;

forming a first insulating film over the gate electrode and the silicon substrate;

forming a recess structure connected to the active region of the memory cell portion and a first contact hole for landing pad formation connected to the active region of the peripheral circuit portion by etching the first insulating film;

forming a first metal material layer over the first insulating film, the recess structure, and the first contact hole to fill the recess structure and the contact hole; and removing portions of the first metal material layer not in the recess structure and the first contact hole to form a conductive line and a landing pad.

22. A method of forming an interconnection in a semiconductor device according to claim 21, wherein after forming the recess structure and the first contact hole, the method further comprises:

forming a metal layer over the first insulating film, the recess structure, and the first contact hole; and forming a metal compound layer over the metal layer, the first insulating film, the recess structure, and the first contact hole.

23. A method of forming an interconnection in a semiconductor device according to claim 22, further comprising:

removing portions of the metal compound layer not in the recess structure and the contact hole, wherein the removal of the metal compound layer and portions of the first metal material layer is performed by a chemical mechanical polishing or an etchback process.

24. A method of forming an interconnection in a semiconductor device according to claim 22, wherein the first metal material layer is formed over the metal compound layer.

25. A method of forming an interconnection in a semiconductor device according to claim 22, further comprising, before the first metal material layer is formed, thermally treating the metal layer and the substrate such that a portion of the metal layer reacts with the substrate to form an ohmic contact layer.

26. A method of forming an interconnection in a semiconductor device according to claim 21, wherein after forming the recess structure and the contact hole, the method further comprises forming a metal layer over the first insulating film, the recess structure, and the contact hole.

27. A method of forming an interconnection in a semiconductor device according to claim 21, wherein after forming the recess structure and the contact hole, the method further comprises forming a metal compound layer over the first insulating film, the recess structure, and the contact hole.

28. A method of forming an interconnection in a semiconductor device according to claim 21, wherein the first insulating film comprises silicon oxide.

29. A method of forming an interconnection in a semiconductor device according to claim 21, the method further comprising:

forming a second insulating film over the conductive line and the landing pad;

forming a second contact hole for interconnection by etching the second insulating film on the landing pad;

forming a second metal material layer filling the second contact hole for interconnection; and forming an interconnection by patterning the second metal material layer.

30. A method of forming an interconnection in a semiconductor device according to claim 29, wherein the second metal material layer comprises a metal selected from the group consisting of Al, Au, Cu, Ag, an Al—Cu compound, an Al—Si—Cu compound and an Ag—Cu compound.

31. A method of forming an interconnection in a semiconductor device according to claim 29, wherein the step of forming the second metal material layer filling the second contact hole for interconnection is performed by a member selected from the group consisting of an aluminum reflow method, a high temperature sputtering method, and a chemical vapor deposition method.

32. A method of forming an interconnection in a semiconductor device according to claim 21, wherein after forming the first insulating film, the process further comprises a step of forming spin on glass (SOG) on the whole surface of the first insulating film and then eliminating the SOG and a part of the first insulating film by a full etchback method.

* * * * *